US012405648B2

(12) United States Patent
Chung et al.

(10) Patent No.: US 12,405,648 B2
(45) Date of Patent: Sep. 2, 2025

(54) PORTABLE ELECTRONIC DEVICE

(71) Applicant: ASUSTeK COMPUTER INC., Taipei (TW)

(72) Inventors: Cheng-Han Chung, Taipei (TW); Hung-Yueh Chen, Taipei (TW); Ching-Yuan Yang, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 274 days.

(21) Appl. No.: 18/334,360

(22) Filed: Jun. 13, 2023

(65) Prior Publication Data

US 2024/0143050 A1    May 2, 2024

(30) Foreign Application Priority Data

Oct. 27, 2022  (TW) .................................. 111140856

(51) Int. Cl.
  *G06F 1/20*     (2006.01)
  *H05K 5/02*    (2006.01)
  *H05K 7/20*    (2006.01)

(52) U.S. Cl.
  CPC ........... *G06F 1/203* (2013.01); *H05K 5/0213* (2013.01); *H05K 7/20145* (2013.01); *H05K 7/20172* (2013.01)

(58) Field of Classification Search
  CPC ...... G06F 1/203; G06F 1/1616; G06F 1/1681; G06F 1/1637; G06F 1/206; G06F 1/20; H05K 5/0213; H05K 7/20145; H05K 7/20172; H05K 7/20209; H05K 7/20409; H05K 7/20972; H05K 7/20136;
  (Continued)

(56) References Cited

U.S. PATENT DOCUMENTS 6,762,931 B2 * 7/2004 Chen .................... G06F 1/1616
                                                    400/688
7,871,319 B2 * 1/2011 Tracy .................... G06F 1/203
                                                    454/195
(Continued)

FOREIGN PATENT DOCUMENTS

| CN | 101997936 | 3/2011 |
|---|---|---|
| CN | 201888057 | 6/2011 |

(Continued)

*Primary Examiner* — Michael A Matey
(74) *Attorney, Agent, or Firm* — JCIPRNET

(57) ABSTRACT

A portable electronic device includes a housing, a heat-dissipation component, a bracket, a door structure, a driving mechanism, and a driven linkage. The housing includes a heat-dissipation opening disposed in the housing. The bracket is disposed in the housing and surrounds the heat-dissipation component. The door structure is configured to move between a closed position covering the heat-dissipation opening and an open position exposing the heat-dissipation opening. The driving mechanism is coupled between the bracket and the door structure to drive the door structure to rotate and move. The driven linkage is coupled between the bracket and the door structure. When the door structure is driven to rotate and move, the door structure drives the driven linkage to rotate and move, so that the driven linkage and the driving mechanism jointly drive the door structure to move between the closed position and the open position.

10 Claims, 10 Drawing Sheets

(58) Field of Classification Search
CPC .......... H05K 7/20163; H05K 7/20963; H05K 1/0201; H05K 2201/09063; H05K 7/20154
See application file for complete search history.

(56) References Cited

U.S. PATENT DOCUMENTS

| | | | |
|---|---|---|---|
| 8,908,364 B2* | 12/2014 | Tseng | G06F 1/162 |
| | | | 345/905 |
| 8,976,524 B2 | 3/2015 | Wang et al. | |
| 9,710,026 B2* | 7/2017 | Delano | G06F 1/1666 |
| 11,262,822 B1* | 3/2022 | North | H05K 7/20409 |
| 11,304,329 B2* | 4/2022 | Singh | H05K 7/20972 |
| 11,809,245 B2* | 11/2023 | Chen | H05K 7/20136 |
| 2004/0114322 A1* | 6/2004 | Agata | G06F 1/203 |
| | | | 361/679.27 |
| 2007/0041157 A1* | 2/2007 | Wang | G06F 1/203 |
| | | | 361/679.48 |
| 2017/0153677 A1* | 6/2017 | Cheng | G06F 1/1637 |
| 2019/0391619 A1* | 12/2019 | Lin | H05K 5/0226 |
| 2021/0089077 A1* | 3/2021 | Wang | G06F 1/3287 |
| 2021/0173455 A1* | 6/2021 | Kulkarni | G06F 1/203 |
| 2023/0146797 A1* | 5/2023 | Chung | G06F 1/203 |
| | | | 361/679.46 |

FOREIGN PATENT DOCUMENTS

| | | |
|---|---|---|
| CN | 102469725 | 5/2012 |
| CN | 102981553 | 3/2013 |
| CN | 104180752 | 12/2014 |
| CN | 103176526 | 5/2016 |
| TW | I776730 | 9/2022 |

* cited by examiner

PORTABLE ELECTRONIC DEVICE

CROSS-REFERENCE TO RELATED APPLICATION

This application claims the priority benefit of Taiwan application serial no. 111140856, filed on Oct. 27, 2022. The entirety of the above-mentioned patent application is hereby incorporated by reference herein and made a part of this specification.

BACKGROUND

Technical Field

The present disclosure generally relates to a portable electronic device.

Description of Related Art

In recent years, the high development of mobile communication technology has created many novel applications. At the same time, various new types of portable electronic devices have been developed, and through continuous improvement, the central processing unit of the current portable electronic devices has considerable computing ability, and can support operation of a variety of software with excellent convenience of use. However, generally speaking, for the portability and convenience of use, on portable electronic devices such as smart phones, tablet computers or wearable devices, the fans are relatively large in size and generate a certain amount of noise during operation. In the past, it was rare to see a design integrating a fan into a portable electronic device. Therefore, in order to maintain CPU of the portable electronic device to operate with higher power and performance, it is necessary to provide additional cooling for the portable device.

SUMMARY

Accordingly, the present disclosure provides a portable electronic device including a housing, a heat dissipation component, a bracket, a door structure, a driving mechanism, and a driven linkage. The housing includes a heat dissipation opening. The heat dissipation component is disposed in the housing and corresponds to the heat dissipation opening. The bracket is disposed in the housing and surrounding the heat dissipation component. The door structure is configured to rotate and move between a closed position covering the heat dissipation opening and an open position exposing the heat dissipation opening. The driving mechanism is pivotally connected between the bracket and the door structure to drive the door structure to rotate and move. The driven linkage is coupled between the bracket and the door structure, so as to drive the driven linkage to rotate and move when the door structure is driven to rotate and move, such that the driving mechanism and the driven linkage jointly drive the door structure to rotate and move between the closed position and the open position.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
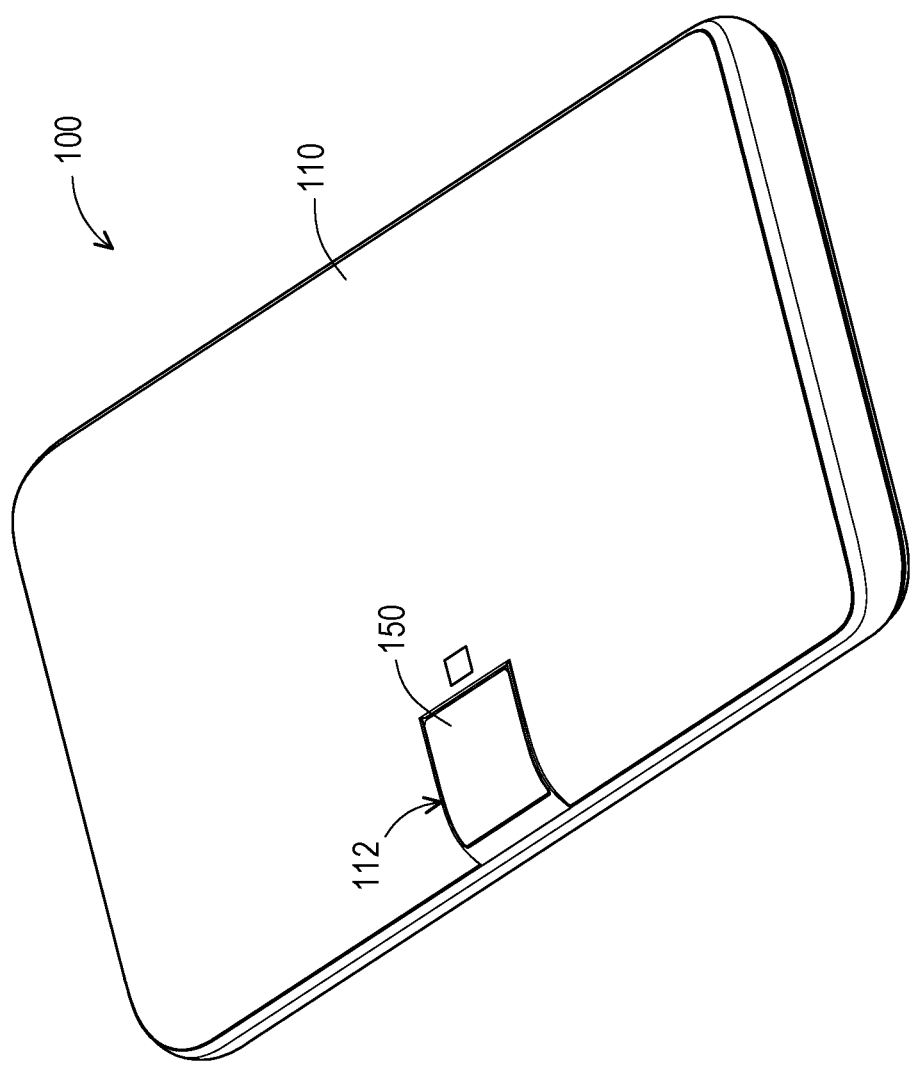
FIG. 1 is a schematic view of a portable electronic device according to an embodiment of the disclosure.

The present invention will now be described more fully with reference to the accompanying drawings, in which exemplary embodiments of the invention are shown. The terms used herein such as "above", "below", "front", "back", "left" and "right" are for the purpose of describing directions in the figures only and are not intended to be limiting of the invention. Moreover, in the following embodiments, the same or similar devices are denoted by the same or similar referential numbers.

The content of this disclosure will be described in detail below with different figures. Please refer to FIG. 1 to FIG. 3, in some embodiments, a portable electronic device 100 may be a portable electronic device such as a smart phone, a tablet computer, or a wearable device. The portable electronic device 100 includes a housing 110, a heating component 120, a heat dissipation component 130, a bracket 140, a door structure 150, a driving mechanism 160 and a driven linkage 170. The housing 110 can be configured to define an accommodating space, and includes a heat dissipation opening 112 on its surface. In this embodiment, the heat dissipation opening 112 is located at a back surface of the portable electronic device 100. The heating component 120 is disposed in the accommodating space defined by the housing 110. In some embodiments, the heating component 120 is, for example, a central processing unit (Central Processing Unit, CPU) of the portable electronic device 100 or other types of heating components, and can be configured on the circuit board in the housing 110. The heat dissipation component 130 may include a set of heat dissipation fins, which may be thermally coupled to the heating component 120.

In other embodiments, the heat dissipation component 130 can also be disposed around the heating component 120 and the heat dissipation component 130 is connected to the heating component 120 by a component such as a vapor chamber, so that the heat dissipation component 130 can perform heat dissipation to the heating component 120. In some embodiments, a contact surface of the heat dissipation component 130 for contacting the heating component 120 or the vapor chamber may be coated with thermal paste to enhance the heat conducting efficiency, but the present disclosure is not limited thereto. In one embodiment, the heat dissipation component (fin) 130 may be made of the same material as the housing 110, or even the heat dissipation component 130 may be an extension part of the housing 110. Certainly, in other embodiments, the heat dissipation component 130 may also be a separate heat dissipation (fin) element, which is fixed in the portable electronic device 100 by, for example, welding.

In some embodiments, the heat dissipation component 130 is disposed in the housing 110 and corresponds to the heat dissipation opening 112. In other words, the heat dissipation opening 112 of the housing 110 can expose at least a part of the heat dissipation component 130 (e.g., heat dissipation fins), so as to improve the heat dissipation efficiency of the heat dissipation component 130. In this embodiment, the heat dissipation component 130 is a passive heat dissipation component, but the disclosure is not limited thereto. The door structure 150 is configured to rotate and move between a closed position for covering the heat dissipation opening 112 and an open position for exposing the heat dissipation opening 112.

Figure 2:
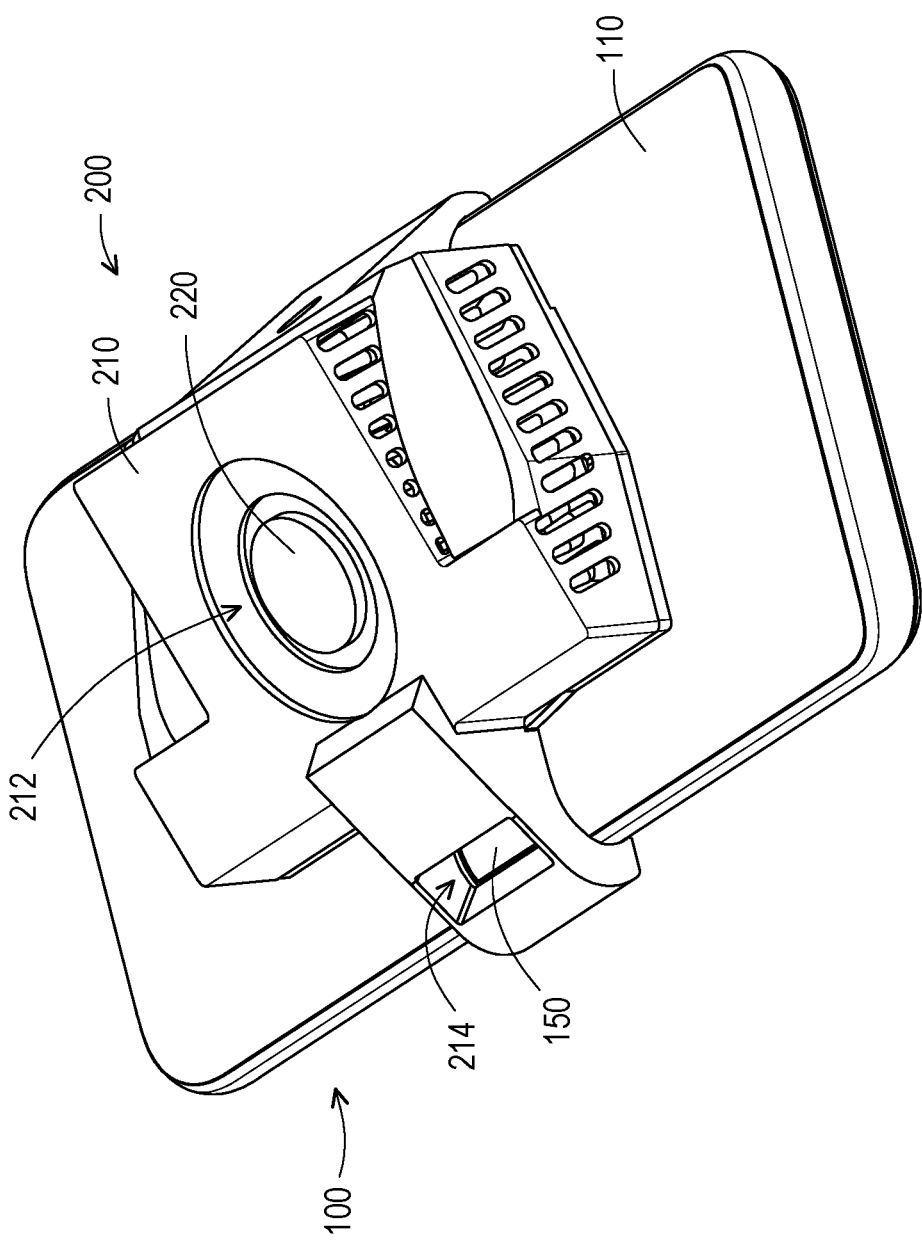
FIG. 2 is a schematic view of a portable electronic device integrating with a fan module according to an embodiment of the present disclosure.
Figure 3:
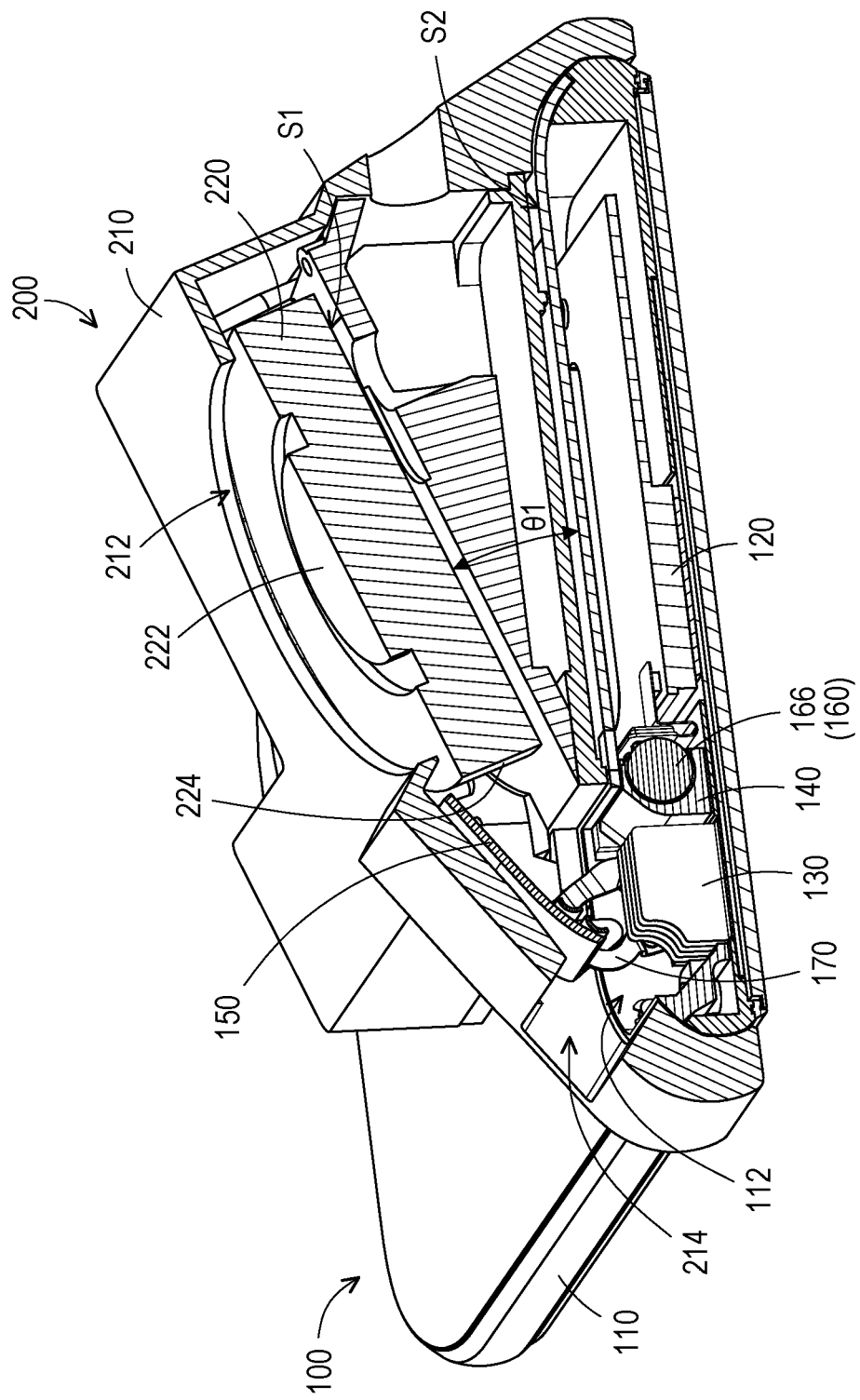
FIG. 3 is a schematic cross-sectional view of the portable electronic device integrating with the fan module in FIG. 2.

In some embodiments, the portable electronic device 100 shown in FIG. 1 can be integrated with other heat dissipation kits to further facilitate the heat dissipation of the heating component 120 and the heat dissipation component 130. For example, in this embodiment, the portable electronic device 100 may include a fan module 200 sleeved on the housing 110 as shown in FIG. 2 and FIG. 3. Accordingly, when heat dissipation is in greater need, the user may detachably arrange the fan module 200 on the housing 110 to integrate with the portable electronic device 100 and facilitate the heat dissipation of the portable electronic device 100. In one embodiment, the fan module 200 may include a frame 210 and a fan 220 disposed in the frame 210. The frame 210 can be fitted with at least a part of the housing 110 so as to be detachably disposed on the housing 110 of the portable electronic device 100. Moreover, the frame 210 may have an opening 212 corresponding to an air inlet 222 of the fan 220 and an opening 214 corresponding to the air outlet 224 of the fan 220. Moreover, the opening 214 of the frame 210 corresponds to the heat dissipation opening 112 of the housing 110.

In some embodiments, when the fan module 200 is sleeved on the portable electronic device 100, the door structure 150 is at the open position as shown in FIG. 3. At the time, the air outlet 224 of the fan 220 faces the heat dissipation component 130, and the door structure 150 extends between the air outlet 224 and the heat dissipation component 130. Accordingly, the door structure 150 at the open position can not only expose the heat dissipation component 130 in the housing 110, but also provide the effect of guiding the air flow. In this embodiment, the air outlet 224 of the fan 210 faces the heat dissipation opening 112 of the housing 110, and an acute angle θ1 is included between a lower surface S1 of the fan 220 and a back surface S2 of the housing 110. In other words, with the design and lifting of the frame 210, the fan 210 can be inclined relatively to the back surface S2 of the housing 110, and the angle of inclined slope may be about the same as or similar to the angle of inclined slope of the door structure 150 at the open position, so that the cooling air of the fan 210 can be blown out from the air outlet 224 and directed toward the heat dissipation component 130 along the door structure 150. Under such a configuration, the cooling airflow provided by the fan 220 can smoothly flow to the heat dissipation component 130 through the guidance of the door structure 150, so as to facilitate the heat dissipation of the heat dissipation component 130.

Referring to FIG. 2 to FIG. 6, in some embodiments, the bracket 140 is disposed in the housing 110 and surrounds the heat dissipation component 130. For example, the bracket 140 may be locked to, for example, a bottom plate in the housing 110, but the disclosure is not limited thereto. In this embodiment, the bracket 140 is configured to encircle the heat dissipation component 130 and define a bracket opening 142. The bracket opening 142 corresponds to the heat dissipation opening 112 of the housing 110 to expose the heat dissipation component 130 together. In this embodiment, the door structure 150 is configured to be driven to rotate and move relative to the bracket 140, so as to rotate and move between a closed position for covering the heat dissipation opening 112 (as the closed position shown in FIG. 4) and an open position for exposing heat dissipation opening 112 and the heat dissipation component 130 underneath (as the open position shown in FIG. 6).

In this embodiment, the driving mechanism 160 is pivotally connected between the bracket 140 and the door structure 150 to drive the door structure 150 to rotate and move. The driven linkage 170 is coupled between the bracket 140 and the door structure 150. Accordingly, when the door structure 150 is driven to rotate and move, the driven linkage 170 is driven to rotate and move, so that the driven linkage 170 and the driving mechanism 160 together drive the door structure 150 to rotate and move between the closed position shown in FIG. 4 and the open position shown in FIG. 6.

Specifically, the driving mechanism 160 includes a gear set 162 and a driving linkage 164 coupled between the gear set 162 and the door structure 150, wherein the gear set 162 is configured to be driven to rotate, so as to drive the driving linkage 164 to rotate and move, and thereby drive the door structure 150 to rotate and move. In detail, the driving mechanism 160 may further include a driving motor 166. The gear set 162 may further include a driver gear 1621 coupled to the driving motor 166 and idle gears 1622, 1623 coupled to the driver gear 1621. The driving motor 166 can, for example, be coupled to the axis of the driver gear 1621 to drive the driver gear 1621 to rotate, and the idle gear 1622 can, for example, be engaged with the driver gear 1621, and the idle gear 1623 can then, for example, be engaged with the idle gear 1622 to drive the driver gear 162 and the idle gears 1622, 1623 to rotate in sequence. It should be noted that the gear set 162 in this embodiment includes a driver gear 1621 and two idle gears 1622, 1623, but the present disclosure is not limited thereto. In other embodiments, the gear set 160 can be customized according to actual needs. Configurations have more or fewer idle gears.

In some embodiments, two opposite ends of the driving linkage 164 can be respectively coupled to the idle gear 1623 and the door structure 150, so that the driving linkage 164 is driven by the idle gear 1623 to rotate, and then drive the door structure 150 to rotate and be lifted. Furthermore, the driving linkage 164 can be coupled to a first coupling point of the door structure 150, and the driven linkage 170 can be coupled to a second coupling point of the door structure 150, so as to jointly drive the door structure 150 to rotate and move through the two coupling points of the door structure 150. In this way, when the door structure 150 is driven to rotate and be lifted, the door structure 150 will drive the driven linkage 170 coupled thereto to rotate along with the door structure 150, so that the driving linkage 164 and the driven linkage 170 can together drive the door structure 150 to rotate and move, so that the door structure 150 rotates and moves between the closed position as shown in FIG. 4 and the open position as shown in FIG. 6.

Figure 4:
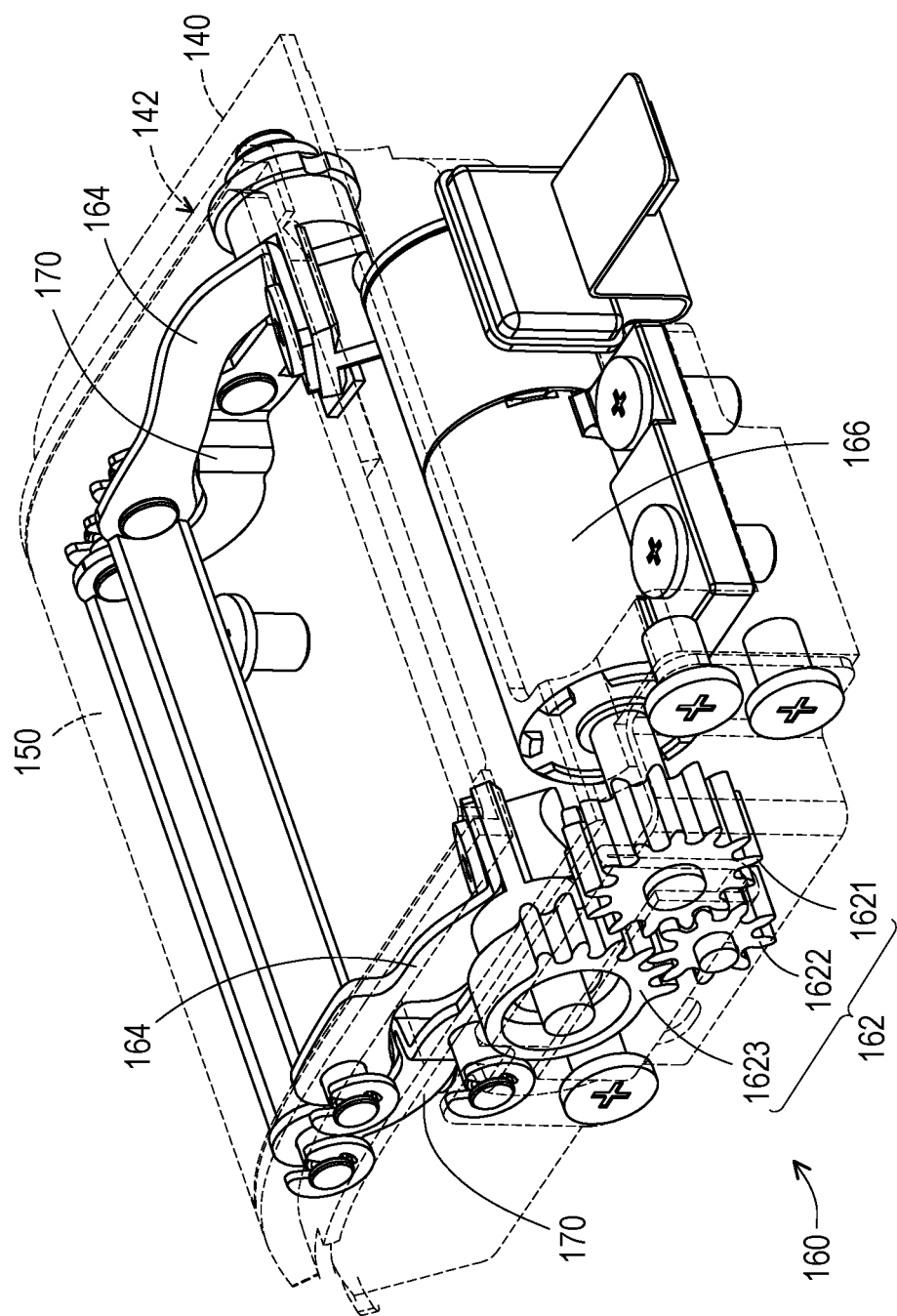
FIG. 4 is a schematic view of a door structure of a portable electronic device at a closed position according to an embodiment of the disclosure.
Figure 5:
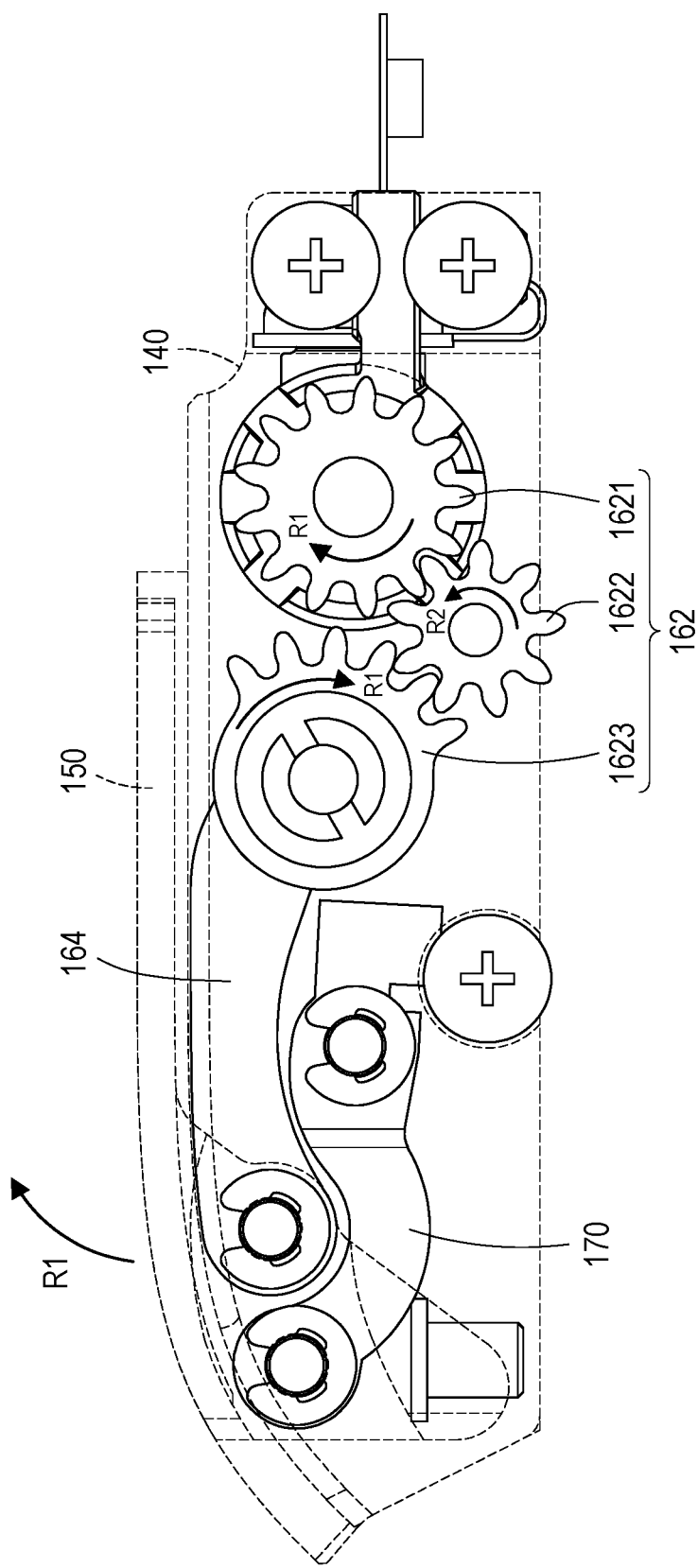
FIG. 5 is a schematic side view of the door structure of the portable electronic device in FIG. 4 at the closed position.

Please refer to FIG. 5, for example, in this embodiment, when the portable electronic device tends to open the door structure 150, the driving motor 166 may be driven by a controller, so that the driver gear 1621 is driven by the driving motor 166 to rotate in the first direction R1 such as a clockwise direction, and the idle gear 1622 is driven to rotate in an opposite second direction R2 such as a counter-clockwise direction, thereby drive the idle gear 1623 to rotate in the first direction R1, e.g., clockwise direction. One end of the driving linkage 164 can be coupled to an axis of the idle gear 1623 through a screw or the like, so as to be driven by the idle gear 1623 to rotate along the first direction R1, e.g., clockwise direction. The first coupling point of the door structure 150 can be coupled to the other end of the driving linkage 164, so as to rotate and be lifted along with the other end of the driving linkage 164, and simultaneously drive the driven linkage 170 coupled thereto to rotate and be lifted together. In this way, the driving linkage 164 and the driven linkage 170 can jointly control the route of rotation and movement of the door structure 150, so that the door structure 150 can rotate and move from the closed position as shown in FIG. 4 to the closed position as shown in FIG. 6.

Figure 6:
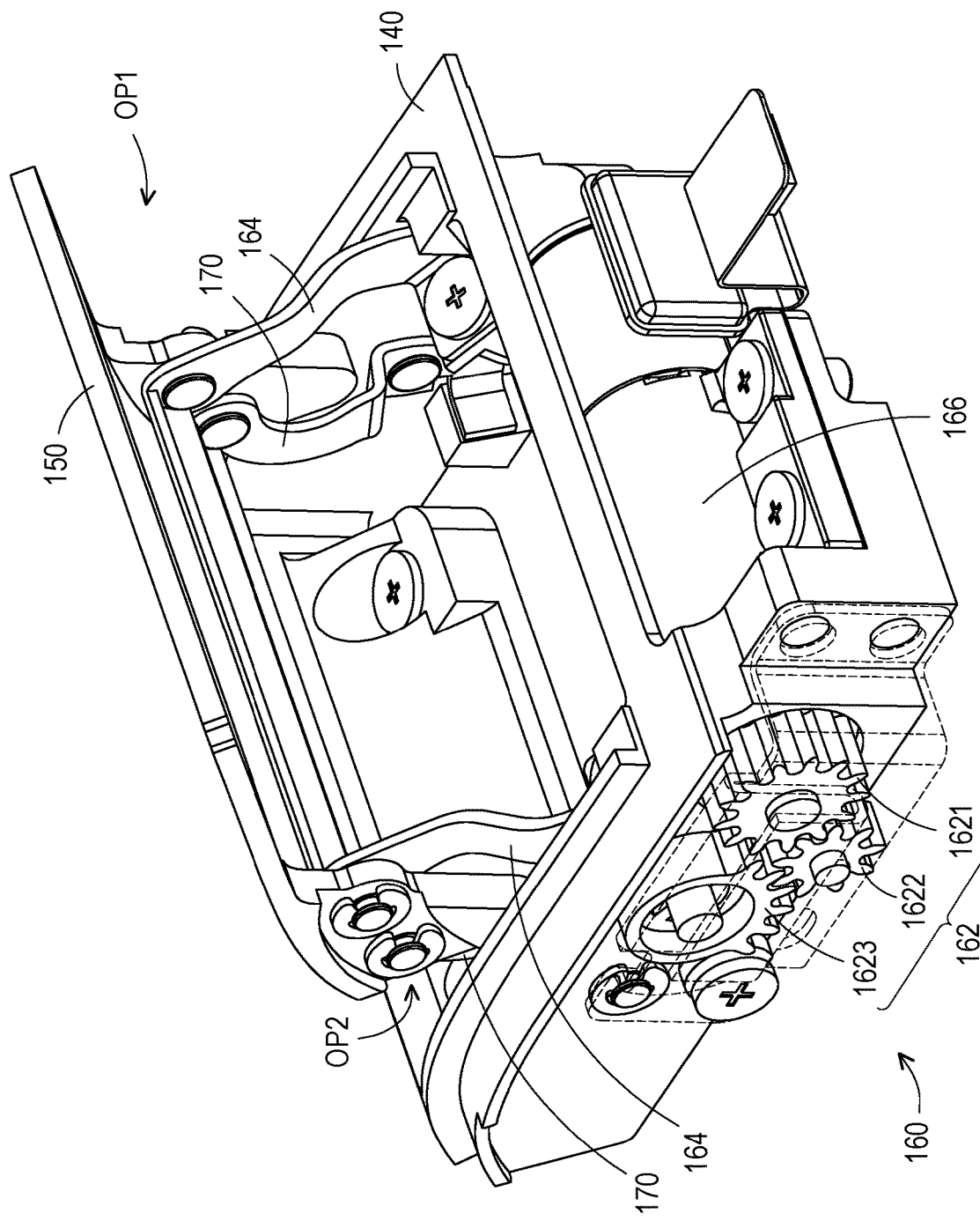
FIG. 6 is a schematic view of the door structure of the portable electronic device in FIG. 4 at an open position.

Similarly, when the portable electronic device tends to close the door structure 150, the driving motor 166 drives the driver gear 1621 to rotate in the opposite direction, so that the door structure 150 can move in the opposite direction from the open position as shown in FIG. 6 to rotate and move to the closed position as shown in FIG. 4. Under such configuration, when a temperature sensor of the portable electronic device detects that the temperature of the heating component 120 is higher than a warning temperature, the temperature sensor can send a heat-dissipation signal to the controller, and the controller may actuate the driving motor 166 accordingly, so as to automatically drive the door structure 150 to switch from the closed position to the open position to facilitate heat dissipation.

In addition, the rotation and movement of the door structure 150 are driven by the driving linkage 164 and the driven linkage 170 altogether, which can further increase the lifting height of the door structure 150. With such configuration, referring to both FIG. 3 and FIG. 6, when the door structure 150 is at the open position, a front side of the door structure 150 may form an air inlet opening OP1 with the bracket 140, and a rear side of the door structure 150 may form an air outlet opening OP2 along with the bracket 140, wherein the air inlet opening OP1 faces the air outlet of the fan, so that the cooling airflow provided by the fan 220 may flow to the heat dissipation component 130 in the housing 110 through the air inlet opening OP1, and the hot airflow that performed heat exchange with the heat dissipation component 130 may flow out of the housing 110 through the air outlet opening OP2 on the rear side, so as to improve the heat dissipation effect of the portable electronic device 100.

In other embodiments, the driving of the driving motor 166 can also cooperate with the fan module 200 to control opening and closing of the door structure 150. For example, the portable electronic device 100 may include a sensing element (such as a magnetic sensor or a pressure/contact sensor, etc.), which is configured to sense whether the fan module 200 is mounted on the portable electronic device 100 or not. When the sensing element senses that the fan module 200 has been installed on the portable electronic device 100, the sensing element may send a sensing signal to the controller, and the controller can activate the driving motor 166 accordingly to drive the door structure 150 to automatically switch from the closed position to the open position to facilitate heat dissipation. In this embodiment, the driving motor 166 can be locked onto the bracket 140 through fasteners, and then the bracket 140 is locked in the housing 110, for example, the bottom plate in the housing 110, along with the driving motor through the fasteners, so as to realize modular assembly.

Referring to FIG. 7 to FIG. 10, It must be noted here that the portable electronic device of the embodiment of FIG. 7 to FIG. 10 is similar to the portable electronic device of the preceding embodiment. The embodiment 10 uses the reference numerals and part of the content of the previous embodiments, wherein the same reference numerals are used to denote the same or similar components, and descriptions of the same technical content are omitted. For the description of the omitted part, reference may be made to the foregoing embodiments, and this embodiment will not be repeated. The difference between the portable electronic device of this embodiment and the portable electronic device of the foregoing embodiments will be described below.

Referring to FIG. 7 to FIG. 10, it is noted that the portable electronic device shown in FIG. 7 to FIG. 10 contains many features same as or similar to the portable electronic device disclosed earlier in the previous embodiments. For purpose of clarity and simplicity, detail description of same or similar features may be omitted, and the same or similar reference numbers denote the same or like components. The main differences between the portable electronic device in FIG. 7 to FIG. 10 and the portable electronic device in the previous embodiments are described as follows.

Figure 10:
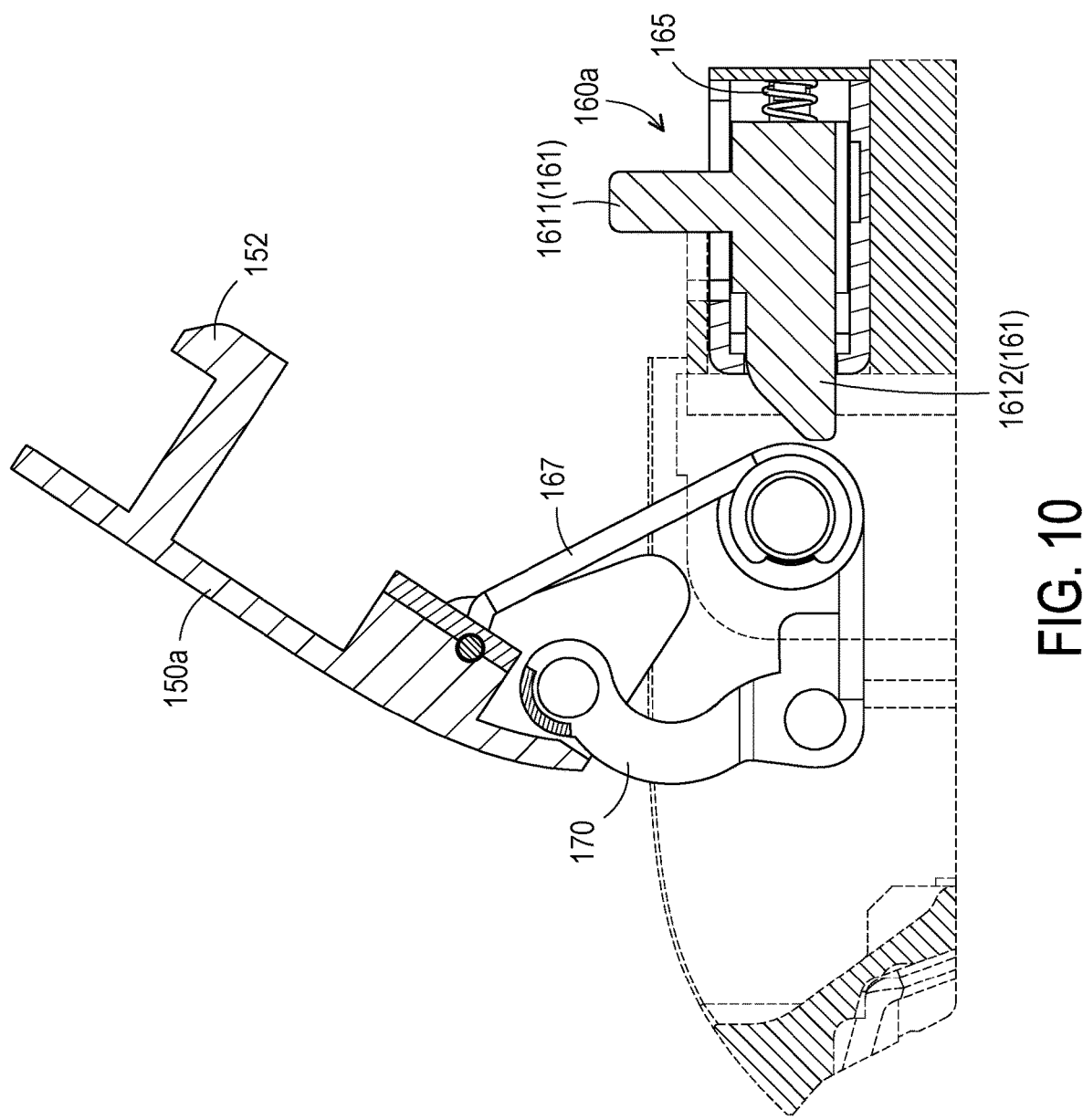
FIG. 10 is a schematic cross-sectional view of the door structure of the portable electronic device in FIG. 9 at the open position.

In this embodiment, the opening and closing of the door structure 150a can be achieved manually. For example, referring to FIG. 7 and FIG. 8, in some embodiments, the driving mechanism 160a may include a locking component 161, which may include a handle 1611 and a locking portion 1612. The handle 161 is configured to be pushed by an external force to drive the locking portion 1612 to move between a locking position as shown in FIG. 8 and a releasing position as shown in FIG. 10. Correspondingly, the door structure 150a may include a hook 152 configured to be structurally interfered with the locking portion 1612. In this way, when the locking portion 1612 is at the locking position, the locking portion 1612 is engaged with the hook 152 of the door structure 150a, so that the door structure 150a is fixed at the closed position as shown in FIG. 8. In addition, the driving mechanism 160a may further include an elastic member 165, which is coupled to and lean between the bracket 140 and the locking component 161, so as to push the locking component 161 toward the hook 152 by its elastic restoring force, so as to maintain the locking relationship between the locking portion 1612 of the locking component 161 and the hook 152 of the door structure 150a.

Figure 8:
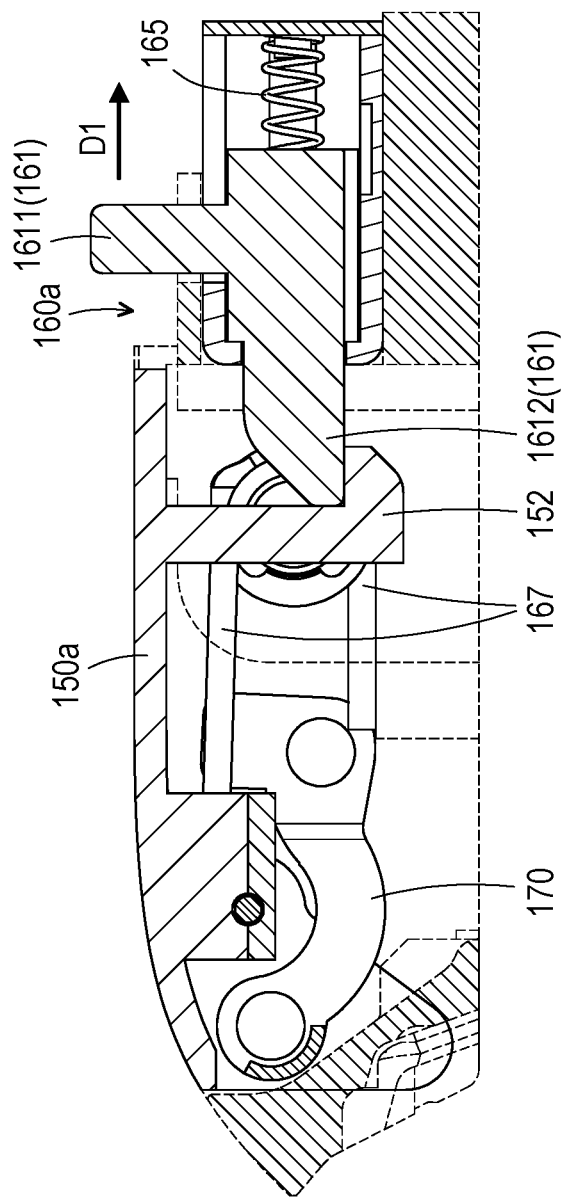
FIG. 8 is a schematic cross-sectional view of the door structure of the portable electronic device in FIG. 7 at a closed position.
Figure 9:
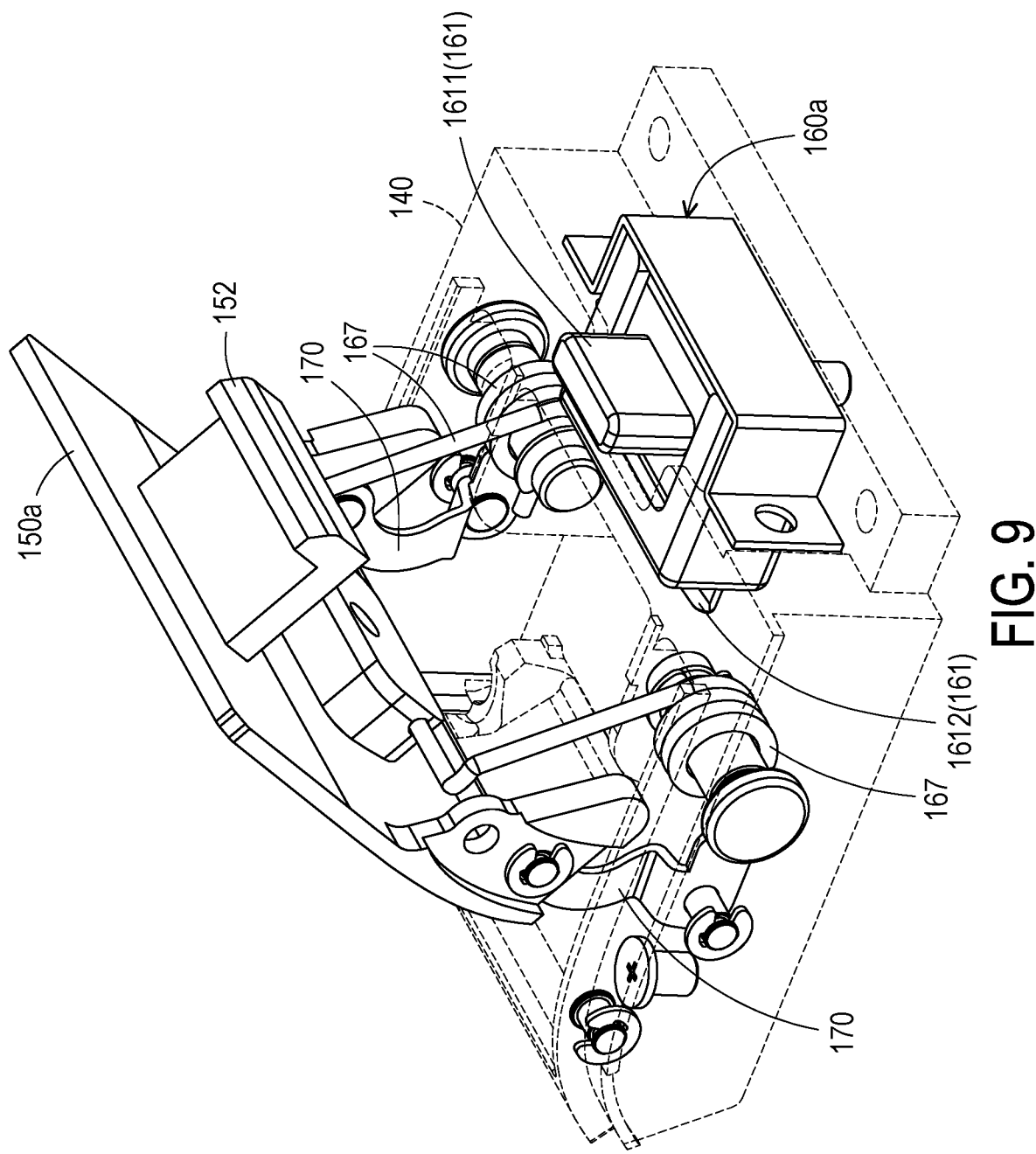
FIG. 9 is a schematic view of the door structure of the portable electronic device in FIG. 7 at an open position.

Please continue to refer to FIG. 8 to FIG. 10, when the user wants to open the door structure 150a, an external force can be applied to the handle 1611 to make the locking component 161 move along the external force direction D1, e.g., the direction away from the hook 152, so as to drive the locking portion 1612 to move away from the hook 152 to the release position as shown in FIG. 9 and FIG. 10, so that the locking portion 1612 and the hook 152 are disengaged.

In this embodiment, the driving mechanism 160a may further include an elastic restoring member 167, which is coupled between the bracket 140 and the door structure 150a. When the door structure 150a is at the closed position as shown in FIG. 8, the elastic restoring member 167 is compressed to generate an elastic restoring force. When the hook 152 is released, the elastic restoring member 167 utilizes its elastic restoring force to drive the door structure 150a to rotate and move upward. At this time, when the elastic restoring member 167 drives the door structure 150a to rotate and move, the door structure 150a also drives the driven linkage 170 to rotate and move, so that the elastic restoring member 167 and the driven linkage 170 jointly make the door structure 150a rotate and move to the open position as shown in FIG. 9. Furthermore, the elastic restoring member 167 can be coupled to a first coupling point of the door structure 150a, and the driven linkage 170 can be coupled to a second coupling point of the door structure 150a, and the two coupling points can jointly control the rotating and moving path of the door structure 150a. In this way, when the door structure 150a is driven by the elastic restoring member 167 to rotate and being lifted, the door structure 150a will drive the driven linkage 170 coupled therewith to rotate and being lifted together, so that the elastic restoring member 167 and the driven linkage 170 can jointly control the rotating and moving path of the door structure 150 to make the door structure 150a to rotate and move between the closed position shown in FIG. 7 and FIG. 8 and the open position shown in FIG. 9 and FIG. 10.

Figure 7:
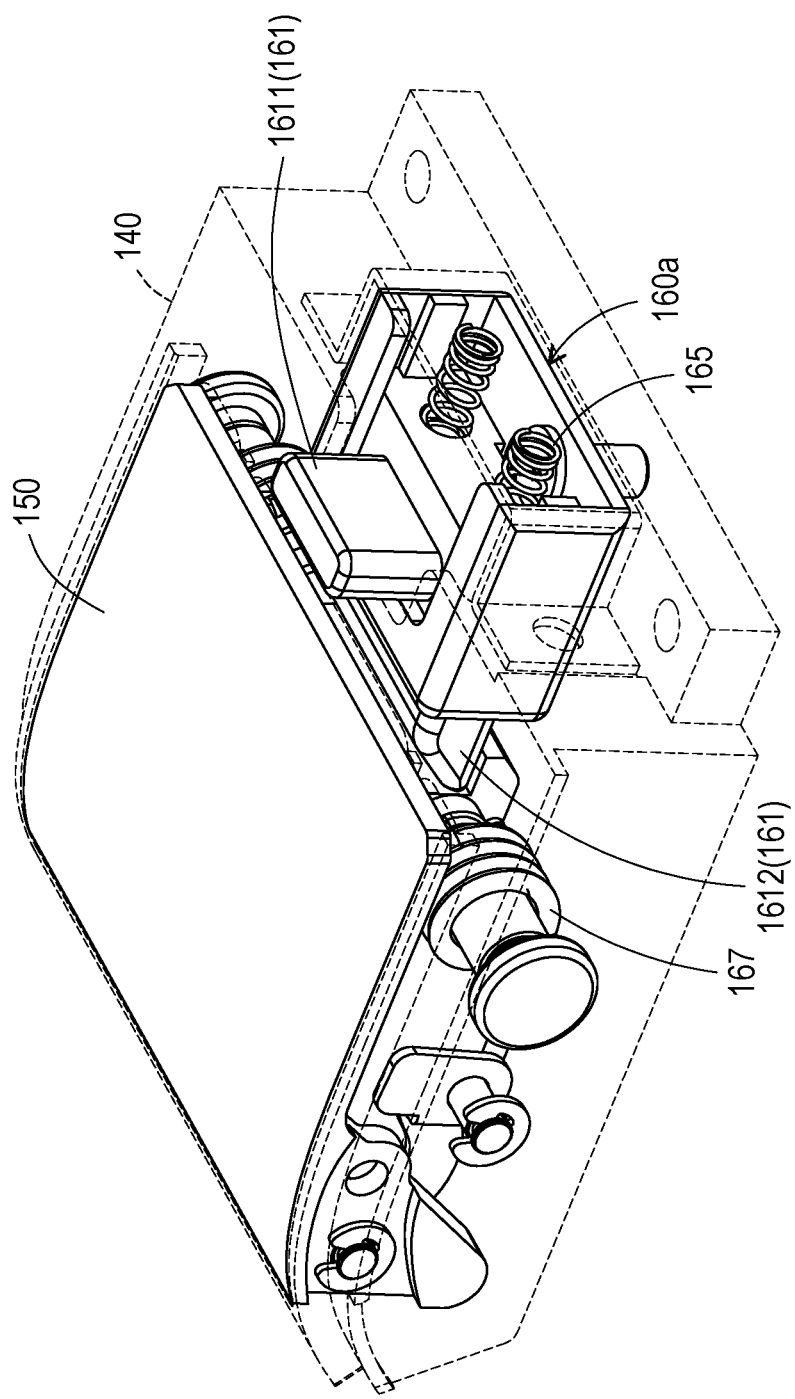
FIG. 7 is a schematic view of a door structure of a portable electronic device at a closed position according to another embodiment of the present disclosure.

Similarly, when the user wants to close the door structure 150a, the user may directly press the door structure 150a down till the hook 152 of the door structure 150a is engaged with the locking portion 1612 of the locking component 161, such that the door structure 150a is returned from the open position shown in FIG. 9 and FIG. 10 to the closed position shown in FIG. 7 and FIG. 8. In addition, the elastic member 165 leaning between the bracket 140 and the locking component 161 can utilize its elastic restoring force to push the locking component 161 toward the hook 152 to maintain the locking relationship between the locking portion 1612 of the locking component 161 and the hook 152 of the door structure 150a.

To sum up, a portable electronic device of the disclosure includes a door structure and a housing having a heat dissipation opening, the heat dissipation opening is configured to expose at least a part of the heat dissipation component in the housing, and the door structure is driven by the driving mechanism and the driven linkage, which are pivotally connected between the bracket and the door structure, so as to cover or expose the heat dissipation opening. In addition, components such as the door structure, the driving mechanism and the driven linkage can be modularly assembled in the portable electronic device through the bracket. Moreover, the rotation and movement of the door structure is jointly driven by the driving linkage and the driven linkage of the driving mechanism, so as to further increase the lifting height of the door structure, thereby further improving the heat dissipation effect of the portable electronic device. With such configuration, when the portable electronic device has higher heat dissipation need, the door structure can be opened manually or automatically to facilitate heat dissipation. Therefore, the portable electronic device can have better heat dissipation efficiency, and the modular design can also simplify the complicated assembly steps. Moreover, the modular design enables the entire module to be tested, such as operation test, etc., before being assembled into the portable electronic device, so as to improve the product yield.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A portable electronic device, comprising:
   a housing comprising a heat dissipation opening;
   a heat dissipation component disposed in the housing and corresponding to the heat dissipation opening;
   a bracket disposed in the housing and surrounding the heat dissipation component;
   a door structure configured to rotate and move between a closed position covering the heat dissipation opening and an open position exposing the heat dissipation opening; and
   a driving mechanism pivotally connected between the bracket and the door structure to drive the door structure to rotate and move; and
   a driven linkage coupled between the bracket and the door structure, so as to drive the driven linkage to rotate and move when the door structure is driven to rotate and move, such that the driving mechanism and the driven linkage jointly drive the door structure to rotate and move between the closed position and the open position.

2. The portable electronic device as claimed in claim 1, wherein the driving mechanism comprises a gear set and a driving linkage coupled between the gear set and the door structure, and the gear set is configured to be driven to rotate, so as to drive the driving linkage to rotate and move, thereby drive the door structure to rotate and move.

3. The portable electronic device as claimed in claim 2, wherein the driving mechanism further comprises a driving motor, and the gear set further comprises a driver gear coupled to the driving motor and a idle gear coupled to the driver gear.

4. The portable electronic device as claimed in claim 3, wherein two opposite ends of the driving linkage are coupled to the idle gear and the door structure respectively.

5. The portable electronic device as claimed in claim 1, wherein the driving mechanism comprises a locking component comprising a handle and a locking portion, and the handle is configured to be pushed by an external force to drive the locking portion to move between a locking position and a releasing position.

6. The portable electronic device as claimed in claim 5, wherein the door structure comprises a hook, and when the locking portion is at the locking position, the locking portion is engaged with the hook, such that the door structure is fixed at the closed position, and when the handle is driven by the external force to move the locking position to the release position, the locking position and the hook are disengaged.

7. The portable electronic device as claimed in claim 6, wherein the driving mechanism further comprises an elastic restoring component coupled between the bracket and the door structure, when the door structure is at the closed position, the elastic restoring component is compressed to generate an elastic restoring force, and when the locking portion and the hook are disengaged, the elastic restoring component drive the door structure to rotate and move by the elastic restoring force.

8. The portable electronic device as claimed in claim 7, wherein when the elastic restoring component drives the door structure to rotate and move, the door structure drives the driven linkage to rotate and move, such that the elastic restoring component and the driven linkage jointly drive the door structure to rotate and move between the closed position and the open position.

9. The portable electronic device as claimed in claim 1, further comprising a fan module, including a frame and a fan disposed in the frame, wherein the frame is configured to be detachably disposed on the housing, and the frame comprises an opening corresponding to the heat dissipation opening.

10. The portable electronic device as claimed in claim 9, wherein an acute angle is included between a lower surface of the fan and a back surface of the housing, and an air outlet of the fan faces the heat dissipation opening.

* * * * *